United States Patent [19]

Crafts

[11] Patent Number: 5,063,429
[45] Date of Patent: Nov. 5, 1991

[54] HIGH DENSITY INPUT/OUTPUT CELL ARRANGEMENT FOR INTEGRATED CIRCUITS

[75] Inventor: Harold S. Crafts, Fort Collins, Colo.
[73] Assignee: NCR Corporation, Dayton, Ohio
[21] Appl. No.: 583,754
[22] Filed: Sep. 17, 1990
[51] Int. Cl.$^5$ .............................................. H01L 27/02
[52] U.S. Cl. ....................................... 357/40; 357/65; 357/71
[58] Field of Search ....................... 357/68, 40, 45, 71, 357/41, 42, 65

[56] References Cited

U.S. PATENT DOCUMENTS

| | | | |
|---|---|---|---|
| 4,511,914 | 4/1985 | Remedi et al. | 357/68 X |
| 4,591,894 | 5/1986 | Kawakami | 357/42 |
| 4,611,236 | 9/1986 | Sato | 357/45 |
| 4,654,689 | 3/1987 | Fujii | 357/51 |
| 4,660,067 | 4/1987 | Ebina | 357/42 |
| 4,661,815 | 4/1987 | Takayama et al. | 340/825.86 |
| 4,733,288 | 3/1988 | Sato | 357/40 |
| 4,771,327 | 9/1988 | Usui | 357/45 |
| 4,819,047 | 4/1989 | Gilfeather et al. | 357/40 X |
| 4,924,290 | 5/1990 | Enkaku et al. | 357/45 X |

*Primary Examiner*—William Mintel
*Assistant Examiner*—Roy Potter
*Attorney, Agent, or Firm*—Jack R. Penrod

[57] ABSTRACT

A high density arrangement of input/output pad cells for general application, but especially useful in non-pad limited design because it conserves substrate area that is not needed for pad cells. The pad cells have their transistors, protection diodes and integrated pull up resistors located in a linear array between the physical pads where the electrical leads make contact. Each pad cell has a bank of N-FETs on one of its lateral sides and a bank of P-FETs on its opposite lateral side. By interchanging the location of the banks of N-FETs and P-FETs of adjacent pad cells relative to the physical pad, a high density arrangement is achieved that is not prone to forming parasitic thyristors or the latch-up problem associated with such parasitic thyristors. The pad cells are shielded from noise pulses and surges on their outer perimeter by a two level power bus, and on their inner perimeter by a similar two level power bus. Connections to and from the pad cells are made by polysilicon conductors located beneath the inner two level power bus. This high density arrangement not only conserves silicon area, but also virtually eliminates latch-up causing noise from passing through the input/output pad cell region.

8 Claims, 5 Drawing Sheets

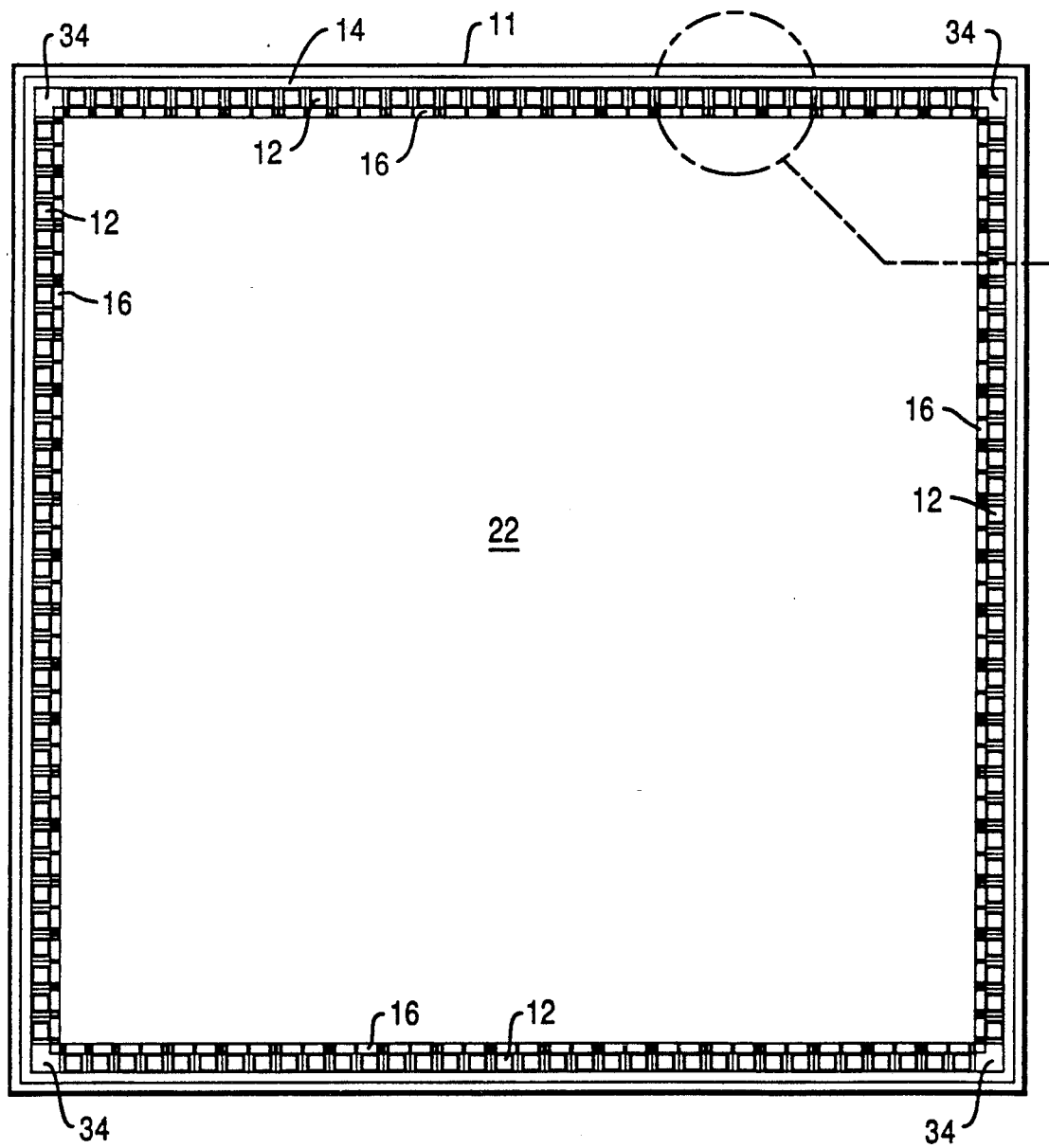

HIGH DENSITY INPUT/OUTPUT CELL ARRANGEMENT FOR INTEGRATED CIRCUITS

BACKGROUND OF THE INVENTION

The present invention relates to integrated circuit products. More particularly, the invention is directed to an arrangement of input/output cells for application specific integrated circuits (ASICs).

In large scale integrated (LSI) circuits and very large scale integrated (VLSI) circuits, such as gate arrays and application specific integrated circuits, the arrangement of the input/output cells around the periphery is a separate design task, i.e. input/output cells are arranged more or less independently from the arrangement of arrays of gates or standard cells in the interior of the integrated circuit. Since LSI and VLSI circuits typically can provide more logic functions from interior gates and/or cells, many input/output designs for LSI and VLSI circuits are known as pad limited designs. A pad limited design occurs when the number of input and output pads, and their associated input/output cells, which can be spaced around the periphery of an integrated circuit is a limiting design factor. The methodology used for a pad limited design is straight forward. First, the number of pads (with their associated input/output cells) that the periphery is required to have, is selected. Next, the perimeter of the input/output pad region is determined from the size of the integrated circuit substrate. Given these parameters, a circuit layout program automatically spaces the input/output pads and cells equally around the periphery. The automatic layout program allots the same space to each input/output pad, and any unused space is equally distributed between pads by the layout program.

At first glance, it appears that the same design methodology and the same computer aided layout program used for pad limited design would also be applicable for non-pad limited integrated circuits. However, because of the distribution of unused space to the spacing between input/output pads, the use of a pad limited design program to a non-pad limited circuit results in a waste of otherwise usable substrate area to nonactive spacing between input/output pads and their associated input/output cells.

In pad limited designs, the distribution of inactive space in the pad region is required to reduce the tendency to latch up. In previous designs, if the inactive space between input/output cells became too small, latch-up conditions could occur. The problem of latch-up is described in U.S. Pat. No. 4,660,067 issued Apr. 21, 1987 to Ebina entitled "Complementary MOS Integrated Circuit Having Means For Preventing Latch-Up Phenomenon", and U.S. Pat. No. 4,591,894 issued May 27, 1986 to Kawakami entitled "Semiconductor Device Having A Plurality Of CMOS I/O Cells Located At The Periphery Of The Chip Arranged In A Direction Perpendicular To The Sides Of The Chip". The former patented invention prevents latch-up by extra fabrication steps (which take extra material) to inhibit the formation of the parasitic devices that cause the latch-up phenomenon, and the latter patented invention arranges its I/O cells perpendicularly so that the gain of any parasitic device is lowered. The lower gain lowers the sensitivity of the parasitic device to noise triggering. Thus, the latter patent lowers the gain by physically spacing the input/output cells (and thereby waste chip space) in order to reduce the possibility of a parasitic devices that may latch-up.

It is, therefore, an object of the present invention to provide a method and arrangement of input/output cells for non-pad limited designs that do not waste space in the input/output pad region.

It is another object of the present invention to provide a method and arrangement of input/output cells that are virtually immune to latch-up.

It is a further object of the present invention to provide a method and arrangement of input/output pads and cells that may be laid out by a computer aided integrated circuit program.

SUMMARY OF THE INVENTION

Briefly stated, in accordance with one aspect of the invention, the foregoing objects are achieved by providing an input/output cell arrangement on an integrated circuit substrate including a two level outer power bus around the periphery of said integrated circuit substrate, and a two layer inner power bus located within the outer two level power bus and encompassing an inner portion of the integrated circuit substrate. Between the outer two level power bus and the inner two level power bus, a plurality of pads for connection of external leads are located. A plurality of input/output cells, each of which is connected to a respective pad, is also located between the outer two level power bus and the inner two level power bus.

In another aspect of the invention, the foregoing objects are achieved by providing a method of arranging input/output cells including the steps of defining an array space for a plurality input/output cells and their respective pads between an outer power bus and an inner power bus, locating a p-channel transistor portion of each input/output cell between its pad and a first adjacent pad in the array space having one side thereof lying along a first side of its pad, locating a n-channel transistor portion of each input/output cell between its pad and a second adjacent pad in the array space having one side thereof lying along an opposite side of its pad, and alternating the order of occurrence of the n-channel transistor portions and the p-channel transistor portions of input/output cells within the array space such that each p-channel portion is located adjacent to a p-channel portion of an adjacent cell and each n-channel portion is located adjacent to an n-channel portion of an adjacent cell.

BRIEF DESCRIPTION OF THE DRAWINGS

While the specification concludes with claims particularly pointing out and distinctly claiming the subject matter which is regarded as the invention, it is believed that the invention will be better understood from the following description of the preferred embodiment taken in conjunction with the accompanying drawings in which:

FIG. 1A is a plan view of an integrated circuit substrate, according to the present invention;

DETAILED DESCRIPTION OF A PREFERRED EMBODIMENT

Figure 1B:
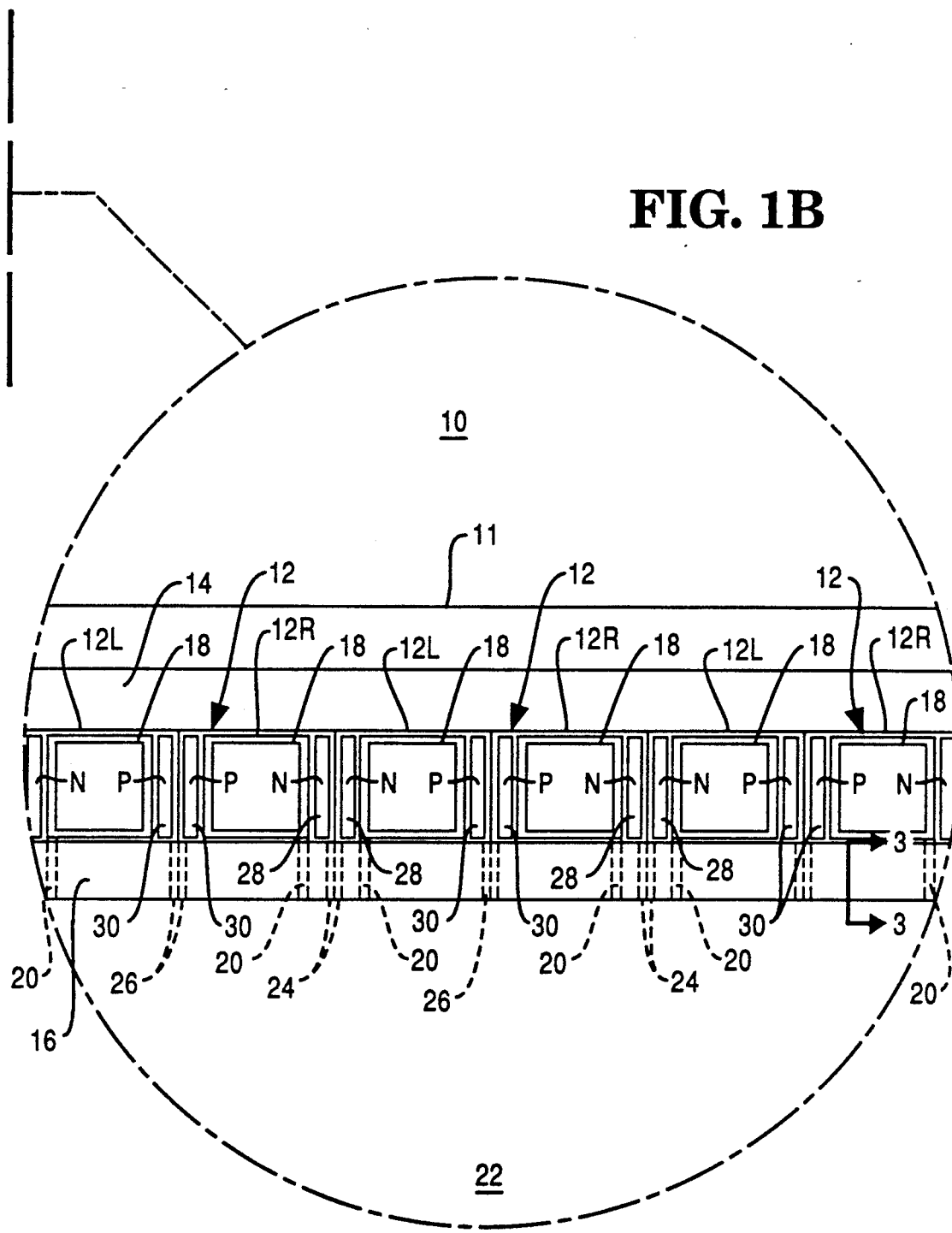
FIG. 1B is an enlarged view of the encircled portion of FIG. 1A.

Referring to FIGS. 1A and 1B, there is shown a CMOS integrated circuit 10 in accordance with the present invention. The integrated circuit 10 in the shown embodiment is for an n-well process device, but a p-well process device is also contemplated, and is considered to be within the scope of the present invention.

The integrated circuit 10 has a substrate 11 having an arrangement of CMOS input/output pad circuits 12. The substrate 11 has a two level power bus 14 around its outer perimeter such that the power bus 14 is located between the edges of the substrate 11 and the outer edges of the input/output pad circuits 12. Since the integrated circuit 10 is made by an n-well process, this substrate 11 will be p-silicon. The input/output pad circuits 12 provide connections between the internal logic circuits (not shown) of the integrated circuit 10 and external integrated circuits and/or similar devices (not shown).

The two level power bus 14 preferably is arranged with a conductor carrying the drain voltage VDD on an upper level and a conductor carrying the source voltage VSS on a lower level, as will be explained in greater detail later. A second two level power bus 16 is located between the inner edges of the input/output pad circuits 12 and internal logic circuits (not shown) located within the inner portion 22 of the integrated circuit 10. The second two level power bus 16 is arranged in the same fashion as the first two level power bus 14 with the conductor carrying VDD on an upper level and the conductor carrying VSS on a lower level. This arrangement places the bus that is usually connected to ground nearest to the substrate. For other processes, that bus closest to the substrate 11 may be the drain bus instead of the source bus of the embodiment shown in FIG. 1, and such modifications are considered to be within the scope of the present invention.

Surrounding the input/output pad circuits 12 on the outer side and the inner side with two level power buses 14, 16 reduces the noise sensitivity of the input/output pad circuits 12, especially to noise conducted into the input/output pad circuits 12 by leads connected to external circuits. The reduction in sensitivity occurs because the power buses 14, 16 tend to shield and/or trap extraneous noise pulses in either the VSS conductor or the VDD conductor, which will be described later in conjunction with FIGS. 2A and 2B.

Referring now to FIG. 1B, further details of the integrated circuit 10 are shown in this partial enlargement of FIG. 1A. The input/output pad circuits 12 each have a metal pad area 18, where electrical contact is made with a respective lead (not shown). There are two different types of input/output pad circuits 12, a left oriented type 12L and a right oriented type 12R. As viewed from the inner portion 22 of the integrated circuit 10, each left oriented type 12L has a polysilicon conductor 20 running from a left side of its pad 18 under the inner two level power bus 16 in order to provide an input connection to internal logic circuits within the inner portion 22. The left oriented type 12L has a bank 28 of N-channel field effect transistors (N-FETs) located to the left of the pad 18, as shown in FIG. 1B, and a bank 30 of P-channel field effect transistors (P-FETs) located to the right thereof. Each of the N-FETs in bank 28 has its gate connected to a common input (as will be described in conjunction with FIGS. 2A and 2B). Similarly, each of the P-FETs in bank 30 has its gate connected to a second common input. The common input of the bank 28 is connected to a polysilicon conductor 24, which runs from the left corner, as viewed from the inner portion 22 of the integrated circuit 10, of the left oriented type 12L of input/output pad under the inner two level bus 16 to the inner portion 22. In a similar manner, the common input of bank 30 is connected to another polysilicon conductor 26 which runs from the right corner, as viewed from the inner portion 22 of the integrated circuit 10, of the left oriented type 12L under the inner two level bus 16 to the inner portion 22.

Each right oriented type 12R of the input/output pad circuits 12 is a mirror image of each left oriented type 12L. Thus, the bank 28 of N-FETs is located on the right side of the pad 18 of the right oriented type 12R, when viewed from the inner portion 22 as shown in FIG. 1B. Similarly, the bank 30 of P-FETs is located on the left side of the pad 18 of the right oriented type 12R. By alternating pad types 12L and 12R around the periphery of the integrated circuit 10, each bank 28 and 30 is assured that it will be located adjacent to a bank 28 or 30 of FETs having a like channel polarity. This is very important because placement of an N-FET adjacent to a P-FET has been known to form a parasitic thyristor device which may latch-up when exposed to noise pulses exceeding the triggering threshold of the thyristor. This arrangement of the input/output pad circuit types 12L and 12R, such that each bank 28, 30 of FETs is adjacent to a bank 28, 30 of FETs having a like channel polarity, virtually eliminates the tendency of the input/output pad circuits 12 to latch up.

Referring back to FIG. 1A, since the present invention concerns non-pad limited designs, a fixed spacing is used between the pads 12 to guard against interference and/or crosstalk from an adjacent pad signal. If space permits, the corners 34 of the integrated circuit 10 may be used as inactive guard region such that a bank 28, 30 of FETs adjoining one side of a corner 34 may be either of the same channel polarity or a different channel polarity as that of a second bank 28, 30 of FETs adjoining the opposite edge of the corner 34, without increasing the tendency of the input/output pads 12 to latchup. If space does not permit such large guard bands, the banks 28, 30 of FETs are arranged such that each bank 28, 30 is always adjacent to a similar polarity bank of FETs, even at the corners 34.

Figure 2A:
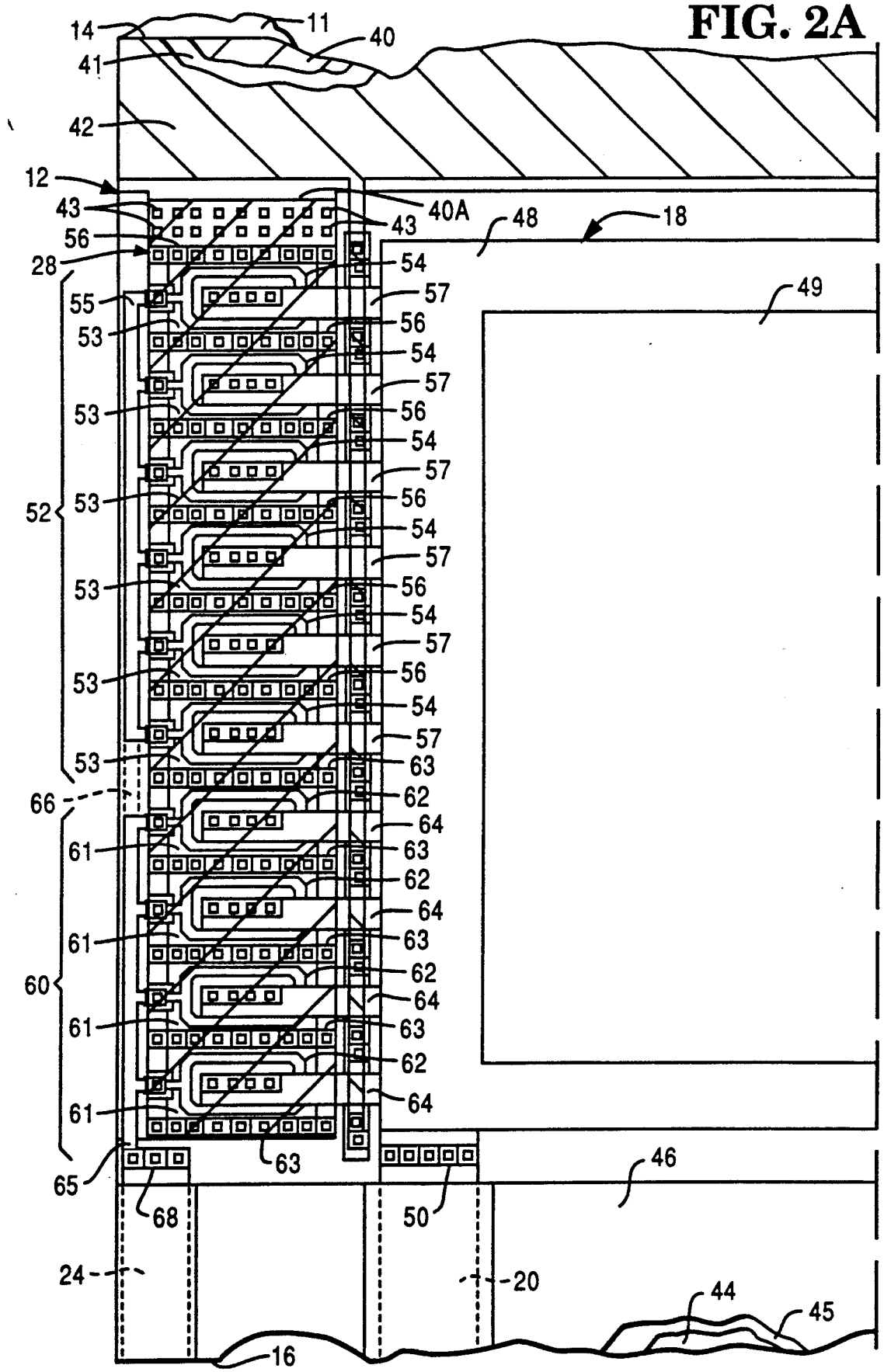
FIGS. 2A and 2B, when joined along the dotted line, provide a plan view of a single input/output pad and its related circuitry, according to the present invention.
Figure 2B:
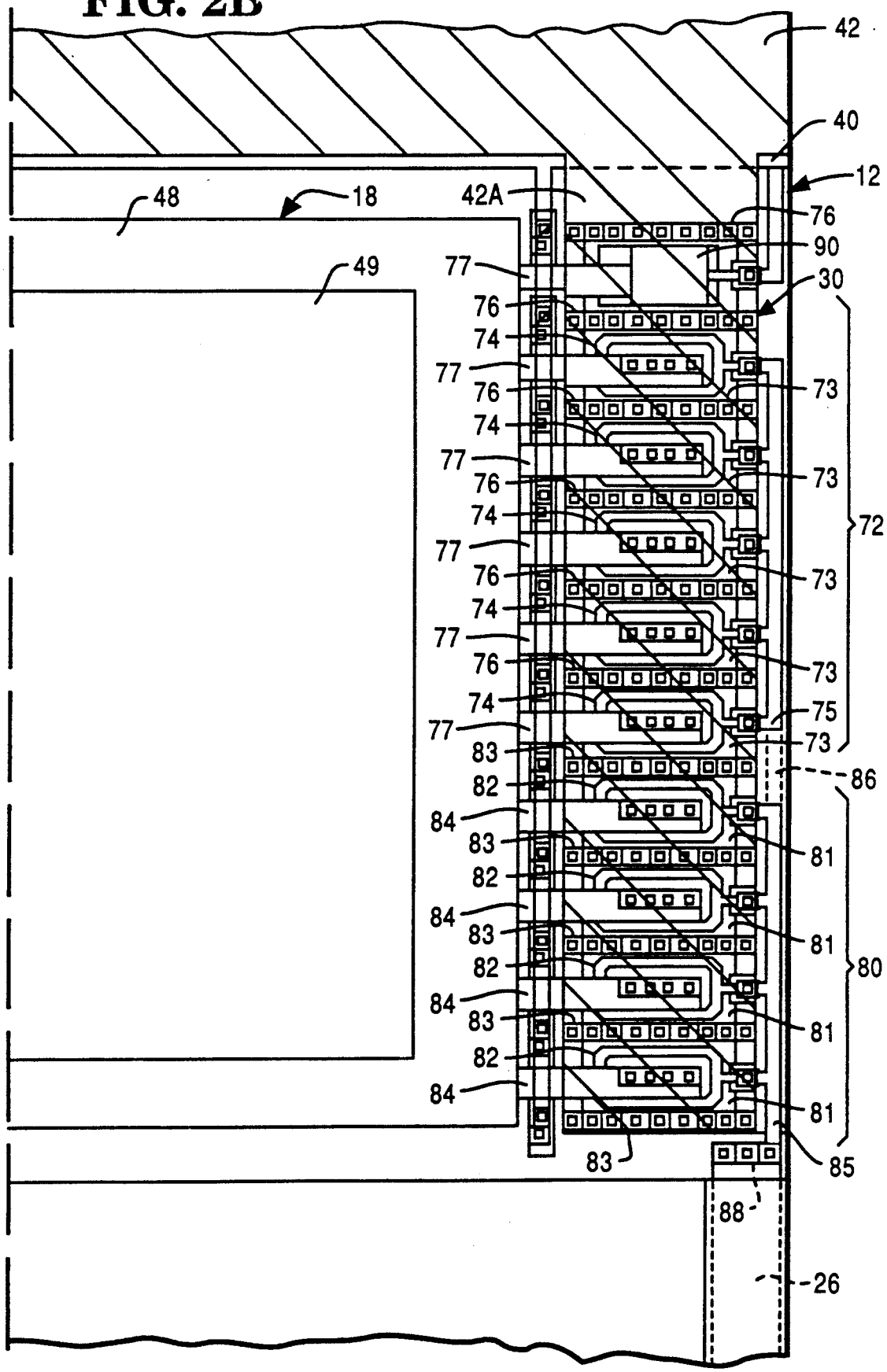

Referring now to FIGS. 2A and 2B, a plan view of a partially broken away portion of the integrated circuit 10 is described. This portion of the integrated circuit 10 shows a single left oriented type 12L of the input/output pad circuits 12 with its immediately surrounding circuitry. Those skilled in the art will be able to construct a mirror image right oriented type 12R from the description of the left oriented type 12L and its illustration in FIGS. 2A and 2B.

The outer two level power bus 14 has a first metallization layer 40 located on a first level on top of the substrate 11. The outer first metallization layer 40 is covered by an insulating layer 41. A second metallization layer 42 is located on a higher level on top of the insulation layer 41.

The inner two level power bus 16 similarly has an inner first metallization layer 44 on a first level thereof. The inner first metallization layer 44 is located next to the substrate 11 except in the regions traversed by the polysilicon conductors 20, 24, and 26. The regions traversed by the polysilicon conductors 20, 24, and 26, are next to the substrate 11 and a layer of insulation (not shown) is located over the polysilicon conductors 20, 24, and 26 in a manner familiar to those skilled in the art. In the regions traversed by the polysilicon conductors 20, 24, and 26, the inner first metallization layer 44 is located upon the layer of insulation over the polysilicon conductors 20, 24, and 26. The inner first metallization layer 44 is covered by an insulting layer 45. An inner second metallization layer 46 is located on a second level thereof on top of the insulation layer 45.

If all of the polysilicon conductors 20, 24, and 26 are formed and insulated prior to the laying down of the first outer metallization layer 40, then the first outer metallization layer 40 and the first inner metallization layer 44 may be performed as parts of the same metallization process.

The pad 18 is formed from a first metallization layer 48 upon the substrate 11, covered by an insulation layer (not shown) with numerous vias (not shown) therein, and further covered by a second metallization layer 49, which is laid directly on top of the insulation layer and connected by the numerous vias to the first layer 48. The second layer 49 is slightly smaller that the first layer 48 and, therefore, part of the first layer 48 is not covered by the second layer 49.

The pad 18 is connected to a via region 50 at the inner left corner of the first layer 48. If the pad 18 is an input pad, a connection is made in the via region 50 from the first layer 48 down to the polysilicon conductor 20. In such a case, signals inputted to the pad 18 are conducted through the via region 50 to the polysilicon conductor 20. The polysilicon conductor transports these signals under the inner two level bus 16 to a logic circuit input (not shown) located in the inner portion 22. Since the banks 28, 30 of FETs are not typically used to provide drive for the input signal to an input pad, the banks 28, 30 typically are connected as electrostatic discharge protection diodes, such connection will be described below. If, on the other hand, the pad 18 is an output pad, then a connection in the via region 50 from the first layer 48 to the polysilicon conductor 20 is not made (although a connection for monitoring or similar function could be made if desired).

The banks 28 and 30, as previously mentioned, are made up of a plurality of N-FETs and a plurality of P-FETs respectively. The bank 28 has a first group 60 of N-FETs 61. Only four N-FETs 61 are shown, but the number may be increased to eight or more if a higher current drive is need. Each N-FET 61 has a gate 62 that is oval in shape. All of the gates 62 are connected to a common point 65 which controls all of the N-FETs 61 in parallel. There are a number of sources 63, which are all connected in parallel to VSS. VSS is supplied from outer first metallization layer 40 by two rows of vias 43 up to a second metallization layer 43A which overlays the bank 28. Additionally, the drains 64 of the N-FETs 61 are all connected in parallel to the first layer 48 of the pad 18. Thus, all the gates 62, the sources 63, and the drains 64 are respectively connected in parallel and, therefore, the N-FETs 61 operate as a single large N-FET device.

The bank 28 has a second group 52 of N-FETs 53. The N-FETs 53 have gates 54, sources 56, and drains 57 respectively connected in a manner similar to the N-FETs 60. The gates 54 are connected to a common conductor 55. The sources 56 are connected to the VSS first metallization layer 40 through second metallization layer conductor 40A. The drains 57 are connected to the first metallization layer 48 of the pad 18. Additionally, the N-FETs 53 have their gates 54 connected to their sources 56. Connected thus, the FETs 53 operate as a single, large electrostatic discharge protection diode.

If the pad 18 is an input pad, typically a connection 66 is made between the common conductor 65 and the common conductor 55. Conversely, if the pad 18 is an output pad, a connection is provided from common conductor 65 to polysilicon conductor 24 through a via region 68. With these connections made, a signal from an inner logic circuit output will be conducted under the inner two level bus 16 to the N-FETs 61, which will provide output drive current to the pad 18 at the desired level, and the N-FETs 53 provide electrostatic discharge protection.

The opposite side of the pad 18, as shown in FIG. 2B, has the bank 30. The bank 30 has a first group 80 of P-FETs 81. Only four P-FETs 81 are shown, but the number may be increased to eight or more if a higher current drive is need. Each P-FET 81 has a gate 82 that is oval in shape. All of the gates 82 are connected to a common point 85 which controls all of the P-FETs 81 in parallel. There are a number of sources 83 that are all connected in parallel to VDD. VDD is supplied from the outer second metallization layer 42 by a direct connection with a conductor 42A which is also on the second layer of metallization overlaying the bank 30. Each of the sources 83 is connected by a via to conductor 42A and to second metallization layer conductor 42 carrying VDD. Also, the drains 84 of the P-FETs 81 are all connected in parallel to the first layer 48 of the pad 18. Thus, all the gates 82, the sources 83, and the drains 84 are respectively connected in parallel and, therefore, all of the P-FETs 81 operate as a single large P-FET device.

The bank 30 has a second group 72 of P-FETs 73. The P-FETs 73 have gates 74, sources 76, and drains 77 respectively connected in a manner similar to the P-FETs 81. The gates 74 are connected to a common conductor 75. The sources 76 are connected to VDD and the outer second layer 42 by the overlying conductor 42A on the second metallization layer. The drains 77 are connected to the first metallization layer 48 of the pad 18. Additionally, the P-FETs 73 have their gates 74 connected to their sources 76. Connected thus, the P-FETs 73 operate as a single large electrostatic discharge protection diode.

If the pad 18 is an input pad, then a connection 86 is made between the common conductor 85 and the common conductor 75. Conversely, if the pad 18 is an output pad, a connection from common conductor 85 to polysilicon conductor 26 is made through a via region 88. With these connections made, a signal from an inner logic circuit output will be conducted under the inner two level bus 16 to the P-FETs 81, which will sink current delivered to the pad 18 at the desired rate. P-FETs 73 provide electrostatic discharge protection for the input/output pads 12.

If a complimentary MOS output is desired, then via region 68 may be connected to via region 88 by a metallization layer path (not shown) connecting polysilicon conductors 24 and 26 as parallel paths. If a pull-up resistor 90 is needed for a particular interface requirement, one or more may be substituted for a FET as shown. Thus, any type of input or output pad circuit may be formed. Because of the shielding on both sides by two level power buses and because of the arranging each pad 12L adjacent to a mirror image pad 12R, the input-/output pads 12 are nearly immune to latch up. This input/output pad array design and layout may be performed manually, or the arrangement may be added to a computer aided design program and performed automatically.

Figure 3:
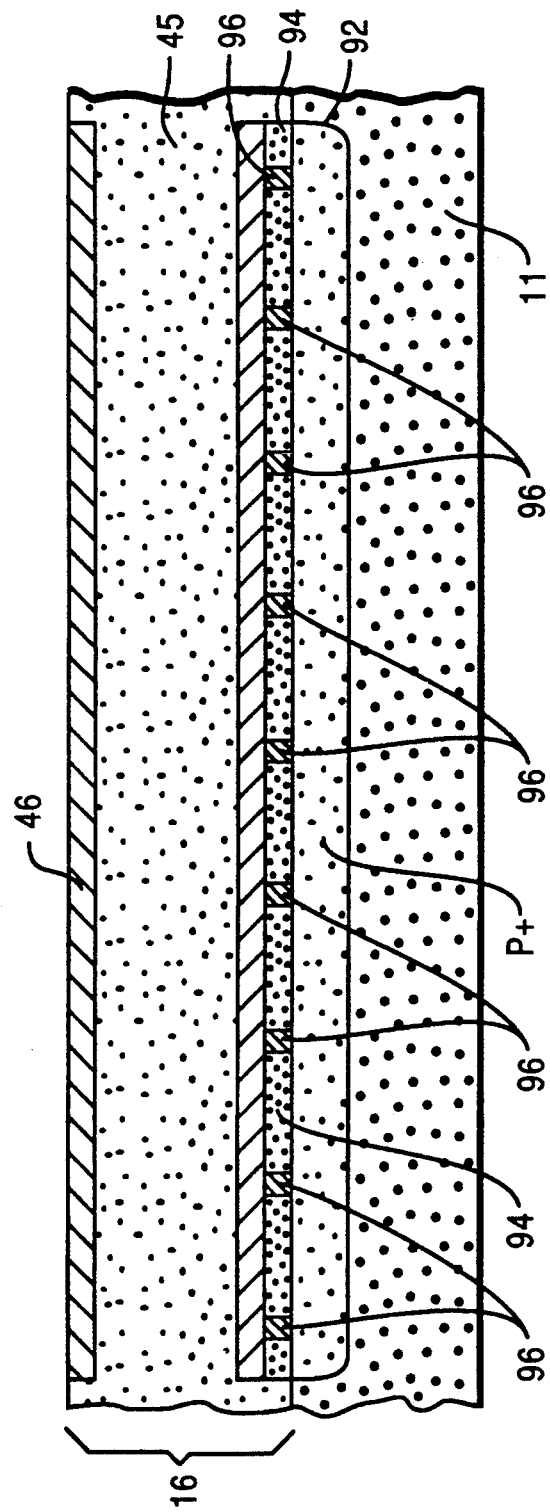
FIG. 3 is partial cross section view along line 3—3 in FIG. 1B, showing an P+ conductive region diffused in the substrate.

Referring now to FIG. 3, an additional feature that virtually eliminates any possibility of latch up is shown in this cross section view. The integrated circuit 10 has a P+ conductive region 92 diffused in the upper portion of the substrate 11. The conductive region 92 is overlaid by an insulating layer 94 of silicon dioxide. The silicon dioxide layer 94 has a number of vias 96. The inner first metallization layer 44 overlays the silicon dioxide layer 94 and penetrates through the vias 96 in order to make electrical contact with the conductive region 92. The rest of the inner two level power bus 16 is located above its first metallization layer 44. The P+ region 92 assists the first metallization layer 44 in absorbing and dissipating voltage spikes and current surges before they reach the logic circuits located in the inner region 22, where they might trigger a latch up. Thus, the combination of the arrangements of the banks 28, 30 (shown in FIG. 1A); the location of the outer and inner two level power buses 14, 16 (shown in FIG. 1A); and the P+ conducting region 92, eliminates latch up from all but the worst of the voltage spikes and current surges.

Thus, it will now be understood that there has been disclosed a high density cell arrangement for an integrated circuit which provides a space conserving design that has a built in immunity from latch up such that precious silicon is not required to provide excessive guard regions.

As will be evident from the foregoing description, certain aspects of the invention are not limited to the particular details of the example illustrated, and it is therefore contemplated that other modifications or applications will occur to those skilled in the art. It is accordingly intended that the claims shall cover all such modifications and applications which do not depart from the true spirit and scope of the invention.

What is claimed as new and desired to be secured by Letters Patent of the United States is:

1. An input/output cell arrangement on an integrated circuit substrate, comprising:
   a first outer power bus located around a periphery of said integrated circuit substrate on a first layer;
   a first inner power bus located within said first outer power bus encompassing an inner portion of said integrated circuit substrate on said first layer;
   a second outer power bus located around the periphery on a second layer vertically above said first outer power bus;
   a second inner power bus located on said second layer vertically above said first inner power bus;
   a plurality of pads located on said integrated circuit substrate between said outer power buses and said inner power buses; and
   a plurality of input/output cells, each connected to a respective pad, also located between the outer power buses and the inner power buses.

2. The input/output cell arrangement according to claim 1, further comprising:
   a plurality of gates located within said inner portion of said integrated circuit substrate; and
   polysilicon means for connecting each of said input-/output cells to its respective gate of said plurality of gates.

3. The input/output cell arrangement according to claim 1, wherein each input/output cell has a p-channel transistor portion and an n-channel transistor portion located on opposite sides of and connected to its respective pad.

4. The input/output cell arrangement according to claim 3, wherein each input/output cell is arranged with its p-channel transistor adjacent to the p-channel transistor of an adjoining input/output cell.

5. The input/output cell arrangement according to claim 3, wherein each input/output cell is arranged with its n-channel transistor adjacent to the n-channel transistor of an adjoining input/output cell.

6. The input/output cell arrangement according to claim 3, wherein each input/output cell is arranged with its p-channel transistor adjacent to the p-channel transistor of an adjoining input/output cell on one side thereof, and its n-channel transistor adjacent to the n-channel transistor of another adjoining input/out-put cell on an opposite side thereof.

7. The input/output cell arrangement according to claim 6, wherein said input/output cells are arranged with their p-channel transistors adjacent to each other, and their n-channel transistors adjacent to each other to prevent a latch-up condition.

8. The input/output cell arrangement according to claim 7, wherein said integrated circuit Substrate has a conductor formed therein beneath said first inner power bus except for the locations of said polysilicon connection means to absorb and dissipate voltage transients and current surges to further prevent a latch-up condition.

* * * * *